US007015823B1

(12) United States Patent
Gillen et al.

(10) Patent No.: US 7,015,823 B1
(45) Date of Patent: Mar. 21, 2006

(54) TAMPER RESISTANT CIRCUIT BOARDS

(75) Inventors: Robert Joseph Gillen, Miamisburg, OH (US); Todd Scott Grimes, Lebanon, OH (US)

(73) Assignee: Systran Federal Corporation, Dayton, OH (US)

( * ) Notice: Subject to any disclaimer, the term of this patent is extended or adjusted under 35 U.S.C. 154(b) by 0 days.

(21) Appl. No.: 10/966,593

(22) Filed: Oct. 15, 2004

(51) Int. Cl.
G08B 21/00 (2006.01)
G08B 13/00 (2006.01)

(52) U.S. Cl. .................. 340/652; 340/541; 340/550

(58) Field of Classification Search ............... 257/211, 257/226, 232, 678–679, 734, 752, 787, 922, 257/638; 174/254; 361/748–837; 713/194; 235/380, 487, 492; 365/52–53, 63, 225.7, 365/226; 380/277; 702/117, 190; 340/652, 340/541, 550
See application file for complete search history.

(56) References Cited

U.S. PATENT DOCUMENTS

| 4,933,898 A | * | 6/1990 | Gilberg et al. ............... 365/53 |
| 5,053,992 A | * | 10/1991 | Gilberg et al. ......... 365/185.04 |
| 5,117,457 A | * | 5/1992 | Comerford et al. ......... 713/194 |
| 5,185,717 A | * | 2/1993 | Mori .......................... 365/52 |
| 5,289,785 A | * | 3/1994 | MacPherson et al. ......... 109/42 |
| 5,309,387 A | | 5/1994 | Mori |
| 5,404,332 A | | 4/1995 | Sato |
| 5,468,992 A | | 11/1995 | Kanekawa |
| 5,533,123 A | | 7/1996 | Force |
| 5,535,168 A | | 7/1996 | Yepez, III |
| 5,557,518 A | | 9/1996 | Rosen |
| 5,614,761 A | | 3/1997 | Kanekawa |
| 5,621,797 A | | 4/1997 | Rosen |
| 5,642,419 A | | 6/1997 | Rosen |
| 5,671,280 A | | 9/1997 | Rosen |
| 5,703,949 A | | 12/1997 | Rosen |
| 5,745,886 A | | 4/1998 | Rosen |
| 5,832,206 A | | 11/1998 | De Jesus |
| 5,878,139 A | | 3/1999 | Rosen |
| 5,892,900 A | | 4/1999 | Ginter |
| 5,910,987 A | | 6/1999 | Ginter |
| 5,915,019 A | | 6/1999 | Ginter |
| 5,917,912 A | | 6/1999 | Ginter |
| 5,920,861 A | | 7/1999 | Hall |
| 5,943,422 A | | 8/1999 | Van Wie |
| 5,949,876 A | | 9/1999 | Ginter |
| 5,982,891 A | | 11/1999 | Ginter |
| 6,088,797 A | | 7/2000 | Rosen |

(Continued)

FOREIGN PATENT DOCUMENTS

WO  WO03019467 A1 * 3/2003

OTHER PUBLICATIONS

Ross Anderson and Markus Kuhn, Tamper Resistance—A Cautionary Note, The Second USENIX Workshop on Electronic Commerce, Nov. 1996, pp. 1-11, USENIX Association, Oakland, California.

(Continued)

Primary Examiner—Zandra V. Smith
Assistant Examiner—Leslie M. Pilar
(74) Attorney, Agent, or Firm—Stevens & Showalter LLP

(57) ABSTRACT

A physical barrier for a circuit board also functions as a tampering sensor or sensors monitored by electrical circuitry that generates a tamper signal for erasing information critical for the operation of the circuit board in the event of sensed tampering. One or more routing matrices configured in at least one programmable device is programmed to interconnect operating as well as optional dummy components on the board so that routing information is erased in the event of sensed tampering.

15 Claims, 3 Drawing Sheets

U.S. PATENT DOCUMENTS

| | | | |
|---|---|---|---|
| 6,112,181 A | 8/2000 | Shear | |
| 6,122,625 A | 9/2000 | Rosen | |
| 6,138,119 A | 10/2000 | Hall | |
| 6,157,721 A | 12/2000 | Shear | |
| 6,175,921 B1 | 1/2001 | Rosen | |
| 6,185,683 B1 | 2/2001 | Ginter | |
| 6,223,273 B1 | 4/2001 | Kanekawa | |
| 6,237,786 B1 | 5/2001 | Ginter | |
| 6,240,185 B1 | 5/2001 | Van Wie | |
| 6,253,193 B1 | 6/2001 | Ginter | |
| 6,275,151 B1 | 8/2001 | Gehlot | |
| 6,292,569 B1 | 9/2001 | Shear | |
| 6,336,095 B1 | 1/2002 | Rosen | |
| 6,363,488 B1 | 3/2002 | Ginter | |
| 6,389,402 B1 | 5/2002 | Ginter | |
| 6,396,400 B1 | 5/2002 | Epstein, III | |
| 6,414,884 B1 | 7/2002 | DeFelice | |
| 6,421,213 B1 | 7/2002 | Blyth | |
| 6,421,291 B1 | 7/2002 | Wanabe | |
| 6,427,140 B1 | 7/2002 | Ginter | |
| 6,445,039 B1 * | 9/2002 | Woo et al. | 257/355 |
| 6,449,367 B1 | 9/2002 | Van Wie | |
| 6,584,004 B1 | 6/2003 | Kanekawa | |
| 6,618,484 B1 | 9/2003 | Van Wie | |
| 6,658,568 B1 | 12/2003 | Ginter | |
| 6,671,675 B1 | 12/2003 | Iwamura | |
| 6,728,904 B1 | 4/2004 | Kanekawa | |
| 6,751,598 B1 | 6/2004 | Yagawa | |

OTHER PUBLICATIONS

Ross Anderson, Tampering of Chip Cards, Unpublished.

Oliver Kömmerling and Markus Kuhn, Design Principles for Tamper-Resistant Smartcard Processors. USENIX Workshop on Smartcard Technology, May 1999, pp. 9-20, Chicago, Illinois.

Ross Anderson and Markus Kuhn, Low Cost Attacks on Tamper Resistant Devices, Security Protocols, 5th International Workshop, LNCS 1361, pp. 125-136, 1997, Paris, France.

Design Security in Nonvolatile Flash and Antifuse FPGAs, Actel Corporation, pp. 1-17, 2002, Sunnyvale, California.

Joan Dyer, Mark Lindemann, Ronald Perez, Reiner Sailer, Leendert Van Doorn, Sean Smith, Steven Weingart, Building the IBM 4758 Secure Coprocessor, IEEE Computer; pp. 57-66, Oct. 2001.

W L Gore & Associates, D3 Tamper Respondent Systems Brochure, 2001.

W.L. Gore & Associates, GORE Tamper Respondent Surface Enclosure brochure.

* cited by examiner

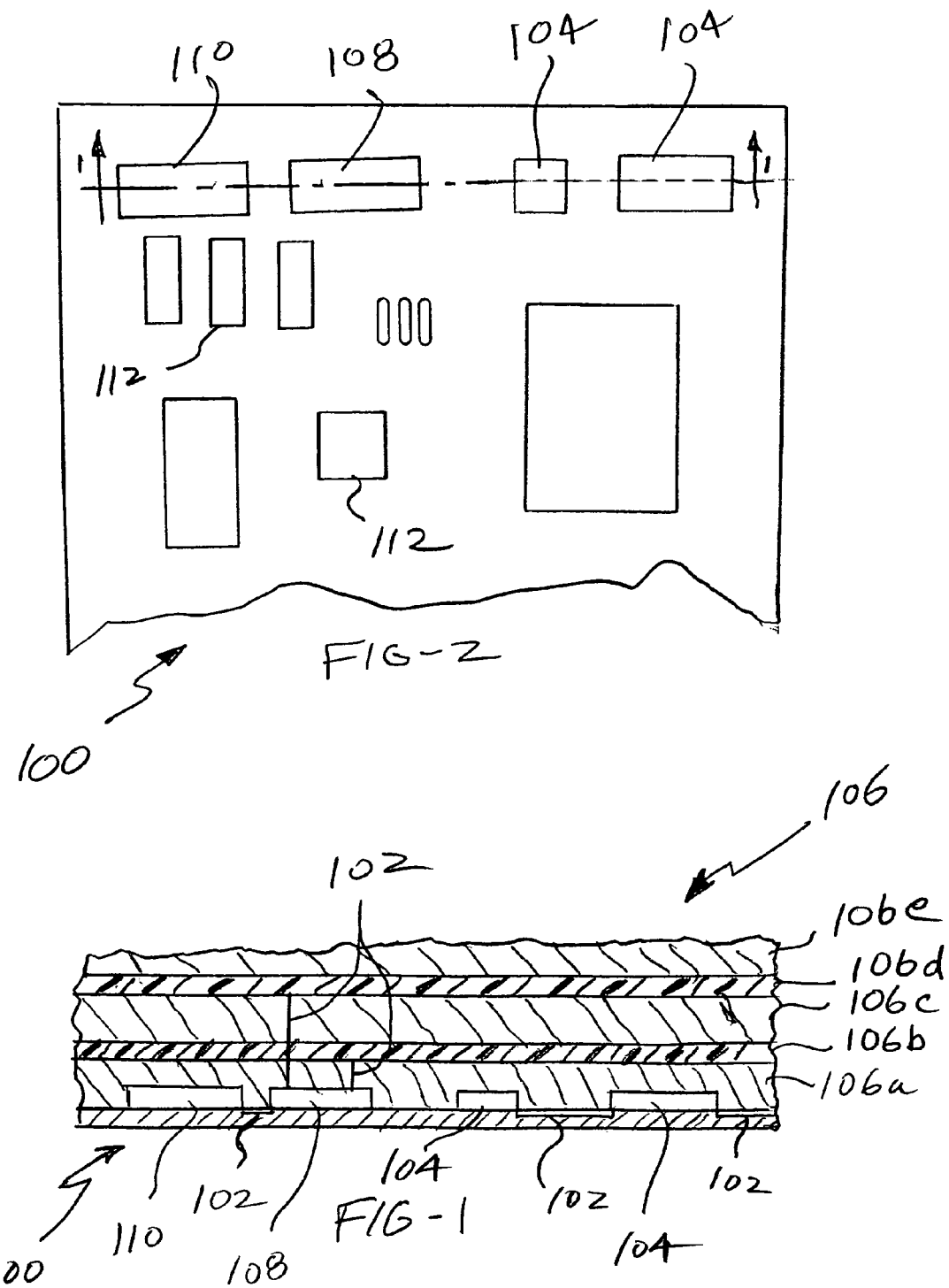

TAMPER RESISTANT CIRCUIT BOARDS

This invention was made with Government support under Contract No. F33615-03-C-5007 awarded by U.S. Air Force (AFMC/AFRL/MLKN). The Government has certain rights in this invention.

FIELD OF THE INVENTION

The invention of the present application relates in general to electronic circuit boards and, more particularly, to hardware protection against persons trying to tamper with such boards to determine sensitive information and technology on the boards.

BACKGROUND OF THE INVENTION

As technology becomes more pervasive in military operations, there is an increasing risk that electronic circuit boards and sensitive information in the form of circuitry on the board or data/programs stored on the boards may fall into enemy hands. Currently, the physical components and printed circuitry of printed circuit boards (PCBs) are protected by the use of ceramic coatings, which are typically applied by a high temperature flame spray process. A ceramic coating adheres tenaciously and acts as a physical barrier to prevent a potential "tamperer" from being able to view the make-up of a coated circuit card. Because of the composition of the coating and the application process, attempts to remove it tend to destroy the board and components beneath the coating. Unfortunately, the high-temperature process that is used to deposit the ceramic coating can damage circuit components and the yield of this process, the number of boards that survive the process, can be as low as 50%.

Accordingly, there is a need for tamper resistant arrangements for PCB's that offer similar or better protection than the current ceramic coatings with consistently higher yields.

SUMMARY OF THE INVENTION

The present invention satisfies this need by means of a physical barrier that also functions as a tampering sensor or sensors monitored by electrical circuitry that generates a tamper signal for erasing information critical for the operation of the circuit board in the event of sensed tampering. One or more routing matrices configured in at least one programmable device is programmed to interconnect operating as well as optional dummy components on the board so that routing information is erased in the event of sensed tampering.

In accordance with one aspect of the present invention, a tamper resistant circuit board comprises a circuit board having electrically conducting paths and electronic components mounted on the circuit board and interconnected by the electrically conducting paths. A physical barrier coats the components and the circuit board and has a plurality of layers that are alternately electrically insulating and electrically conducting. Electrical circuitry is mounted on the circuit board and connected to at least one electrically conducting layer for sensing a tamperer seeking to determine construction or operation of the circuit board and for generating a tamper signal indicative of tampering. In response to the tamper signal, security circuitry erases information critical for operation of the circuit board.

In accordance with another aspect of the present invention, a tamper resistant circuit board comprises a circuit board having electrically conducting paths with at least one programmable logic component mounted on the circuit board. Electronic components are mounted on the circuit board and are interconnected by the electrically conducting paths and by programmed paths through the at least one programmable logic component. A physical barrier coats the at least one programmable logic component, the electronic components and the circuit board with the physical barrier having a plurality of layers which are alternately electrically insulating and electrically conducting. Electrical circuitry is mounted on the circuit board and is connected to at least one electrically conducting layer for sensing a tamperer seeking to determine construction or operation of the circuit board. The electrical circuitry generates a tamper signal indicative of tampering which is sent to security circuitry for erasing the programmed paths through the at least one programmable logic chip in the event of detected tampering.

In accordance with an additional aspect of the present invention, a tamper resistant circuit board comprises a circuit board having electrically conducting paths and at least one programmable logic component mounted on the circuit board. Electronic components are mounted on the circuit board with the at least one programmable logic circuit and the electronic components being interconnected by the electrically conducting paths. A physical barrier coats the at least one programmable logic component, the electronic components and the circuit board, the physical barrier having a plurality of layers which are alternately electrically insulating and electrically conducting. Electrical circuitry mounted on the circuit board and connected to at least one electrically conducting layer of the physical barrier senses a tamperer seeking to determine construction or operation of the circuit board and generates a tamper signal indicative of such tampering. Security circuitry, in responsive to the tamper signal, erases a program contained in the at least one programmable logic chip.

BRIEF DESCRIPTION OF THE DRAWINGS

The following detailed description of the preferred embodiments of the present invention can be best understood when read in conjunction with the following drawings, where like structure is indicated with like reference numerals, and in which:

FIG. 1 is a schematic illustration, not to scale, of a cross section of a portion of a tamper resistant printed circuit board of the present application taken along section line 1—1 of FIG. 2;

FIG. 2 is a schematic view of a portion of a tamper resistant printed circuit board of the present application;

DETAILED DESCRIPTION OF THE INVENTION

Figure 3:
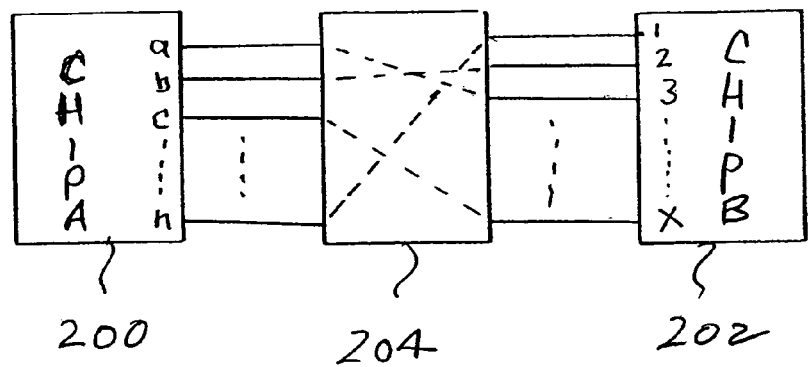
FIG. 3 illustrates two components interconnected through a routing matrix.

In the following detailed description of the preferred embodiments, reference is made to the accompanying drawings that form a part hereof, and in which is shown by way of illustration, and not by way of limitation, specific preferred embodiments in which the invention may be practiced. It is to be understood that other embodiments may be utilized and that changes may be made without departing from the spirit and scope of the present invention.

Reference is now made to FIG. 1 that schematically shows a cross section of a portion of a tamper resistant printed circuit board (PCB) 100 taken along the section line 1—1 of FIG. 2 including one aspect of the present invention. As illustrated, the PCB 100 includes electrically conducting paths 102 and electrical components 104 mounted on the PCB 100 which are coated with a physical barrier 106 that comprises a plurality of layers, with five layers 106a–106e being shown. The resulting multi-layer coating has alternating electrically conducting layers 106b, 106d, etc. and electrically insulating layers 106a, 106c, 106e, etc. to server both as a physical barrier and as a tampering sensor or sensors. Electrical circuitry 108 is connected to at least one of the electrically conducting layers to monitor for tampering. Connection of the electrical circuitry 108 to the two electrically conducting layers 106b and 106d is schematically illustrated in FIG. 1. The electrical circuitry 108 generates a tamper signal in response to sensing tampering with the physical barrier 106. Security circuitry 110 is responsive to the tamper signal to erase information critical for the operation of the circuit board 100.

The physical barrier 106 protects the circuit board 100 in that attempts to remove it tend to destroy the board and components beneath the barrier. Alternately and/or in addition, the electrical circuitry 108 can monitor the resistance of one or more of the conductive layers 106b, 106d, etc. and/or other electrical characteristics of the physical barrier 106, such as the capacitance created between the various layers of the physical barrier 106, to detect a tamperer. Thus, tampering with the board to remove the physical barrier 106 can directly destroy the board and/or the components mounted thereon or, since such tampering changes monitored characteristics of the physical barrier, those changes are detected and result in destruction of information critical for operation of the board.

The physical barrier 106 can be formed using a sol-gel. As is well known in the art, the sol-gel process involves the transition of a solution system from a liquid "sol" (mostly colloidal) into a solid "gel" phase. Utilizing the sol-gel process, it is possible to fabricate advanced materials in a wide variety of forms, such as, ultra fine or spherical shaped powders, thin film coatings, fibers, porous or dense materials, and extremely porous aero gel materials. The starting materials used in the preparation of the "sol" are usually inorganic metal salts or metal organic compounds, such as, metal alkoxides. In a typical sol-gel process, the precursor is subjected to a series of hydrolysis and polymerization reactions to form a colloidal suspension, or a "sol". The sol-gel material is such that it allows the introduction of fine powders of metals and other conductive materials into the composition so that conductive sol-gel coatings containing various conductive powders of graphite, nickel, and silver can be deposited. Concentrations of conductive materials ranging from 25–50% w/w form thick viscous pastes suitable for coating circuit boards. A circuit board is first coated with a nonconductive layer, such as a sol-gel layer without the addition of any electrically conductive materials, with the nonconductive layer being coated with conductive sol-gel to form a conductive layer. These processes are repeated for the number of layers that are required for a given application. For ease of use and lower cost, graphite can be used as the conductive material with a combination of about 0.4 gm graphite powder (1–5 micron size) to about a gram of sol-gel solution having been found to provide good reproducible conductive layers.

While all layers of the physical barrier 106 can be made of sol-gel (insulating) and sol-gel doped with graphite, metal or other electrically conductive powder (conductive), they can also be constructed using a combination of sol-gel and epoxy coatings. Epoxy coatings are very adherent thus adding to the barrier effect, are more uniform and are thicker than sol-gel layers so that thick, non-conductive layers can be formed using epoxy. Sol-gel can also become brittle, especially when used as an initial insulating layer; however, it has been discovered that sol-gel layers have more electrical conductivity than epoxy layers doped with the same concentrations of conductive materials. Accordingly, epoxy coatings can be used as insulating layers and sol-gels doped with a conductive material, such as a metal or graphite powder, can be used as conductive layers.

One way to defeat an attempt at tampering is to obscure the function of the target circuit board. Besides the technique of not labeling circuit components, which is well known in the art, in accordance with another aspect of the present invention, additional unused components 112 or parts, referred to as "dummy" components, can be added to a board design to confuse a tamperer, see FIG. 2. The additional unused components serve no purpose as far as the functionality of the board is concerned, but have electrically conducting paths or "traces" connecting them to other functional components and/or to other dummy components on the board. To conceal the fact that these are dummy components, signals, either duplicated actual signals or dummy unused signals, can be sent from operational components to the dummy components and/or dummy signals can be generated by one or more dummy components and distributed among the dummy components. This anti-tampering circuit technique must be implemented at the board design phase of production, but is simple, inexpensive and effective.

In accordance with another aspect of the present invention, one or more programmable logic circuits, such as field programmable logic arrays (FPGAs), complex programmable logic devices (CPLDs), or other known devices, are used as a "routing matrix" for selectively interconnecting components mounted on the board using paths programmed through the programmable logic circuits. A routing matrix is used to programmably interconnect all important signal traces on a circuit board through one or more components to obscure the connectivity of the functional components mounted on the board. To further mask the true operational circuitry on the board, programmable paths can also be used to interconnect dummy components with other dummy components as well as with actual operational components. Once tampering is detected, the information defining the programmable paths can be erased and the board thus rendered useless. By downloading software to a programmable logic circuit, the devices can be used to connect the outputs of certain chips to the inputs of other chips in a way that is not visible to an observer.

Typically, programming information for programmable logic circuits, such as FPGAs and other devices that do not retain information after power is removed, is stored in a memory, for example an EEPROM (Electrical Erasable Programmable Read Only Memory) and/or an SEEPROM (Serial Electrical Erasable Programmable Read Only Memory), with the memory being present on the circuit board so that the programmable logic circuits can be set up using the contents of the on board memory. However, boards can be designed with no on-board memory for setting up the programmable logic circuits. In other words, the routing information and/or functional configuration of programmable logic circuits need not be stored on the boards. In this event, the programmable logic circuits are programmed with the necessary operating information, being either functional or routing information, before a mission, and this information is present in the programmable logic devices only as long as the power supply to the devices is maintained. If a weapons system containing such a board is downed in enemy territory and the power supply to the board is lost, stored functional/routing information is lost and the board will be totally useless.

For such off-board programming, lost power and resulting loss of information is the first line of defense against tampering. If for any reason the power supply to the board is not interrupted, then the tamperer has to penetrate the physical barrier, described above which is being actively monitored, to reach the components and surface of the circuit board. The sensors or tamper triggers defined by the multiple layers of the physical barrier ensure that the information in the programmable logic devices is completely erased. Thus, the physical barrier and the sensors/monitoring performed by the physical barrier is the second line of defense against tampering in the invention of the present application. It is noted that if memory or CPLDs, which retain information after power is removed, are used on the circuit boards, the contents of the memory or CPLDs can be completely erased and power can be positively removed from the programmable logic devices that do not retain information after power is removed to ensure that all information stored on a circuit board in accordance with the present invention will be completely erased as soon as tampering is detected.

As described above, the flow of signals on a circuit board may be concealed by means of one or more routing matrices to interconnect components mounted on the board and defining the resources of the board. For example, on a board with a processor or other electronic controller and related memory, the addressing and data lines from the controller could be switched through the routing matrix to make it more difficult for a tamperer to determine the board's functionality. As noted above, the programmable routing matrices could also be used with dummy components to an additional level of deception further confusing an attempted tampering.

To clarify the use of a routing matrix, a simple implementation is illustrated in FIG. 3 wherein two components "Chip A" 200 and "Chip B" 202 are interconnected through a routing matrix 204. Outputs "a", "b", "c" and "n" of Chip A 200 are to be interconnected to inputs "3", "2", "x" and "1" of Chip B 202, respectively. With knowledge of the nature of Chip A and Chip B and how they are to be interconnected, one can infer what these components do. The routing matrix 204 obscures the connectivity information. Instead of routing output "a" directly to input "3", output "a" is routed into the routing matrix 204 and back out again at an arbitrary point of the routing matrix 204 to input "3". Similarly, outputs "b", "c" and "n" are routed to inputs "2", "x" and "1" through the routing matrix 204. Since the internal interconnections through the routing matrix 204 are not visible to anyone but its designer, the interconnections of the outputs of Chip A 200 to Chip b 202 cannot readily be determined without knowledge of how the programmable routing matrix 204 is programmed.

Figure 4:
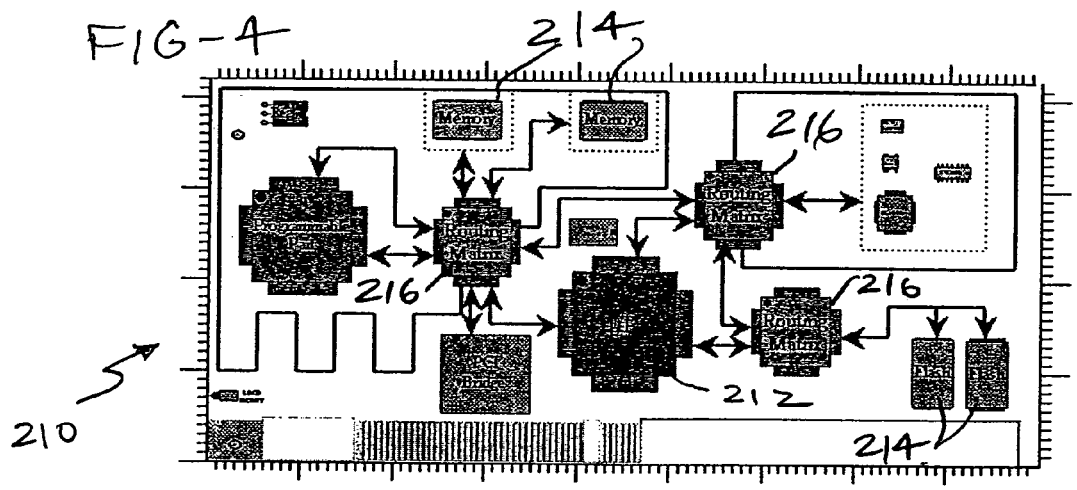
FIG. 4 shows a Common Programming Interface (PCI) circuit board or card having components mounted thereon with three routing matrices interspersed among the other components.

As illustrated in FIG. 3, the routing matrix comprises only one programmable logic circuit; however, to increase security further, the routing matrix itself can be distributed among many separate programmable devices and embedded among a system's components in all areas of a circuit board. As long as timing constraints for proper operation of the functional components of the circuit board are met, signals can be routed through routing matrix components in entirely different areas of a board before arriving at the required destinations, i.e., a given signal can be routed through several different devices. FIG. 4 shows a Common Programming Interface (PCI) card 210 with a microprocessor (UP) 212, memory 214, and other assorted parts with three routing matrices 216 interspersed among the other components. Since the routing matrices 216 are all interconnected, any one signal between board components would be impossible to trace.

As noted earlier, to further deter determination of the structure/operation of the circuit board, no identification markings are made on any of the components or other parts on the board as shown in FIG. 2. Even if it can be determined that a certain part is indeed a programmable logic device, there is no way to determine whether it contains routing information or functional information without significantly damaging the device.

Figure 5:
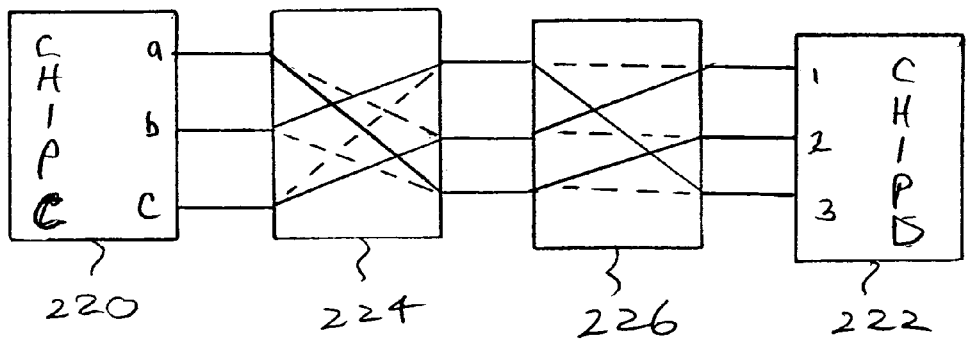
FIG. 5 illustrates two components, a Chip C and a Chip D identically interconnected by two different connection paths through two routing matrices.

Multiple routing matrices also allow for introduction of a variety of routing schemes to be used for several instances of the same board. See, for example, the very simplified illustration of FIG. 5 wherein the outputs of a Chip C 220 are interconnected to the same inputs of a Chip D 222 by two different connection paths through routing matrices 224, 226, one path shown in solid lines and a second path shown in dotted lines. Further, the routing information inside any one programmable may be dynamic but rather can be changed at nearly any time using an external interface so that given circuit boards can be differently configured for each mission. The routing matrices in FIG. 5 can be programmed in any one of several ways as long as the signal on output "a" gets to the "2" input and so on. Note that each signal from Chip C 220 gets to its proper destination at Chip D 222. Also note that the hardware or components and printed circuit board traces between the chips are unchanged. The only difference is the routing information internal to the routing matrices 224, 226. Thus, by controlling the programming of the programmable logic devices used to configure the routing matrices 224, 226 of circuit boards with the same set of hardware can have very different routing. There is no way to determine which signal is on a given trace without having knowledge of the programming of the routing matrices 224, 226.

The reconfigurable nature of the programmable logic devices enables the second line of defense noted above since once tampering is detected by any sensing method, the interconnections of the components through the routing matrices 224, 226 are broken and the paths that were provided through the routing matrices 224, 226 are erased.

Sensors or triggers are any system, material or structure on a target circuit board that generates signals that board tampering has occurred. As noted above, several characteristics can be monitored as triggers so that a tamper signal can be generated to activate destruction of sensitive information on the target board.

As described above, electrical properties of conducting layers of multi-layer physical barrier coatings can be measurable. For example, the resistance of one or more conductive layers can be monitored and capacitance between any two conductive layers of the physical barrier can be monitored. It is a very easy to detect resistance changes in one or more conductive layers when tampering occurs and electronic circuitry can be used to detect short, opens, or a change in resistance of the conductive layer or layers. Similar methods using capacitance as a trigger can also be used by measuring the amount of charge/volt or capacitance between any two conductive layers of the physical barrier that serve as plates for the capacitor or capacitors which are being measured. Capacitance is measured by building a detection circuit based on the following equation $$c = \frac{1}{v_c} \int i dt$$

where c is capacitance, $v_c$ is the voltage across the capacitor and i is the current through the capacitor. A parallel plate capacitance nominally follows the equation $$C = \frac{\varepsilon_o A}{d},$$

where $\varepsilon_O$ is the permittivity constant, A is the area of the each of the plates, and d is the distance between them. Unfortunately, no board will follow this equation exactly and will have to be tested to determine the physical capacitance. It may be useful to utilize filler materials between the parallel conductive coatings with low dielectric constants so that a slight change in the plate area may more easily be detected.

Other characteristics of a looping portion of a conductive layer or circuit board trace can be used as a sensor or trigger by monitoring the status of a loop that is either normally closed or normally open. A normally closed (NC) loop is any sort of conductive line that runs out from a detector, follows an arbitrary path around a circuit board, and then returns to the detector. It carries a signal that is sent from the detector and is thus received by the same detector after it has traveled around the loop. If the loop is damaged, the detector will not receive the correct signal, and damage to the board is detected. A normally open (NO) loop follows the same principle except that its default (non-tampered) state is open (no connection) and reception of the sent signal by the detector indicates tampering. This concept can be implemented in two innovative ways using circuit board traces and conductive coating layer patterns.

Figure 6:
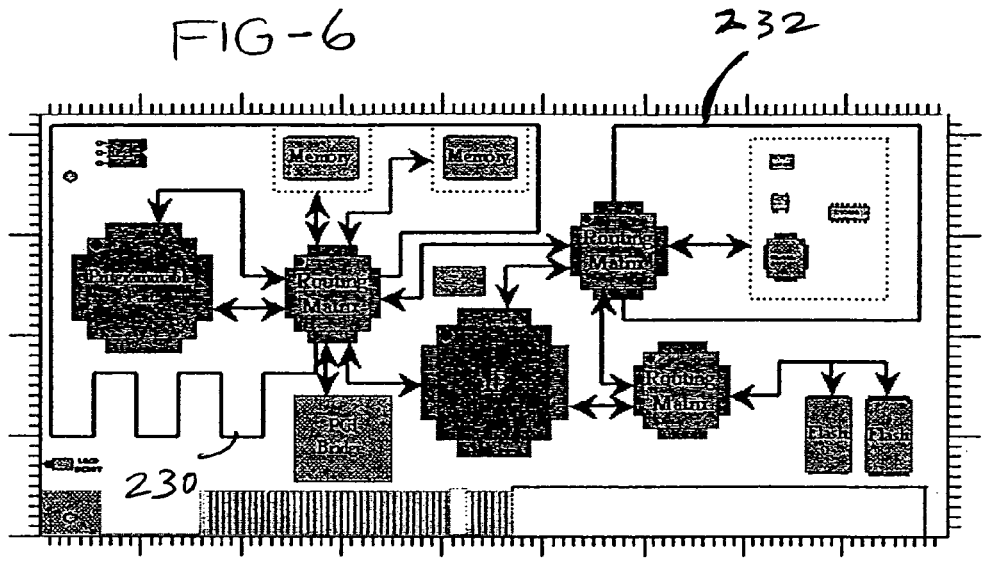
FIG. 6 schematically illustrates NC loops and demonstrates how NC loops can be routed near sensitive board components to detect tampering in those areas.

Appropriate NC loops for the loop detection aspects of the present invention can be configured using a routing matrix configured in a programmable logic device as described above. Also, when designing the layout of a target circuit board, extra traces are drawn from an output pin of a component, around the board in a complex, arbitrary pattern and back to an input pin of the same chip. The component generates a signal and verifies that the proper signal has successfully traversed the loop and returned to the component. If a path through a programmable logic device is opened and/or a trace on the board is damaged by a tamperer so that a NC loop is opened, the tampering is sensed. Loops 230 and 232 shown in FIG. 6 represent NC loops and schematically demonstrate how NC loops can be routed near board components containing sensitive information to detect tampering in those areas.

Figure 7:
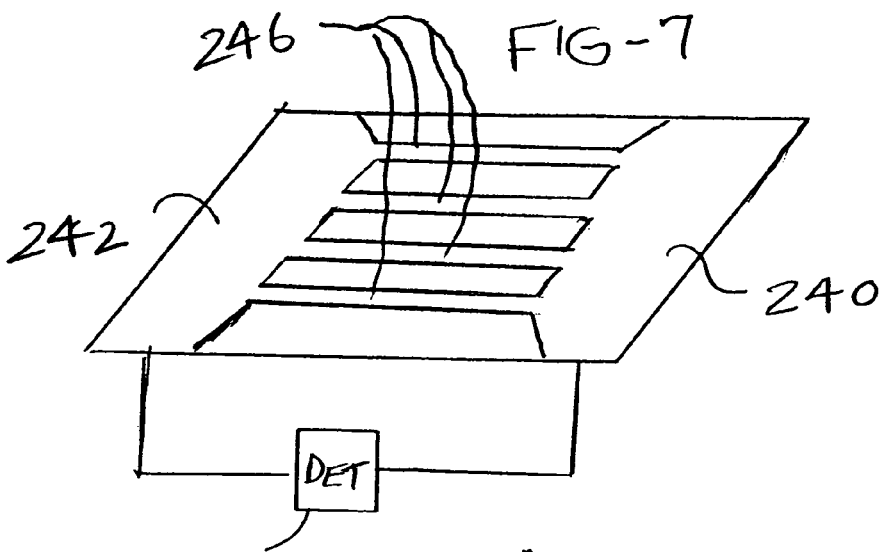
FIG. 7 illustrates how sections of a conductive layer can be connected to a detector on a circuit board so that the conductive layers can be used as NC loops.
Figure 8:
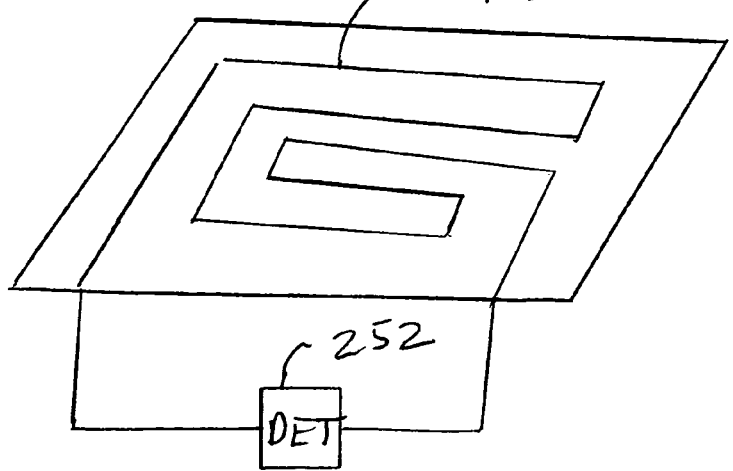
FIG. 8 schematically illustrates how more effective NC loops can be built into coatings on a circuit board.

In addition to board traces and paths through components, conductive layers of the multi-layer physical barrier can be used as NC loops. FIGS. 7 and 8 show schematic descriptions of such NC loops. In FIG. 7, sections 240, 242 of one or more conductive layers, one layer shown in FIG. 7, can be connected to a detector 244 on the board so that the conductive layers can be used as NC loops in the same manner as NC loops made from electrically conductive traces on the board. Also, through the use of masking or lithography, patterns, such as the pattern 250 connected to a detector 252 as shown in FIG. 8, can be built into the coatings to make more effective NC loops. This type of pattern will permit the detection of damage to the board's multi-layer coating. As shown in FIG. 7, multiple strips 246 of the conductive layer are shown so that resistance would more likely be measured; however, one of the strips 246 could be used to form a NC loop and monitored as such as should be apparent.

Having described the invention in detail and by reference to preferred embodiments thereof, it will be apparent that modifications and variations are possible without departing from the scope of the invention defined in the appended claims.

What is claimed is:

1. A tamper resistant circuit board comprising:
   a circuit board having electrically conducting paths formed thereon;
   at least one programmable logic component mounted on said circuit board; electronic components mounted on said circuit board and interconnected by said electrically conducting paths and by programmed paths through said at least one programmable logic component;
   a physical barrier coating said at least one programmable logic component, said electronic components and said circuit board, said physical barrier having a plurality of layers which are alternately electrically insulating and electrically conducting;
   electrical circuitry mounted on said circuit board and connected to at least one electrically conducting layer for sensing a tamperer seeking to determine construction or operation of said circuit board and for generating a tamper signal indicative of tampering; and
   security circuitry responsive to said tamper signal for erasing said programmed paths through said at least one programmable logic chip.

2. A tamper resistant circuit board as claimed in claim 1 further comprising means for controlling said at least one programmable logic component to interconnect input terminals to output terminals through at least two different sets of paths through said at least one programmable logic component.

3. A tamper resistant circuit board as claimed in claim 2 wherein said control means for said at least one programmable logic component dynamically changes said at least two different sets of paths.

4. A tamper resistant circuit board as claimed in claim 1 wherein said programmable logic component is programmed by a source external to said circuit board.

5. A tamper resistant circuit board as claimed in claim 1 further comprising at least one dummy component mounted on said circuit board and being interconnected by said electrically conducting paths to at least one of said electronic components.

6. A tamper resistant circuit board as claimed in claim 5 wherein said at least one of said electronic components interconnected to said at least one dummy component generates signals that are sent to said at least one dummy component.

7. A tamper resistant circuit board as claimed in claim 6 wherein said at least one dummy component is connected to one of said at least one programmable logic component.

8. A tamper resistant circuit board comprising:
a circuit board having electrically conducting paths formed thereon;
at least one programmable logic component mounted on said circuit board;
electronic components mounted on said circuit board, said at least one programmable logic circuit and said electronic components being interconnected by said electrically conducting paths, and said at least one programmable logic component being programmed to define interconnection paths for said electronic components;
a physical barrier coating said at least one programmable logic component, said electronic components and said circuit board, said physical barrier having a plurality of layers which are alternately electrically insulating and electrically conducting;
electrical circuitry mounted on said circuit board and connected to at least one electrically conducting layer for sensing a tamperer seeking to determine construction or operation of said circuit board and for generating a tamper signal indicative of tampering; and
security circuitry responsive to said tamper signal for erasing a program contained in said at least one programmable logic chip.

9. A tamper resistant circuit board as claimed in claim 8 wherein said at least one programmable logic component is programmed by a source external to said circuit board.

10. A tamper resistant circuit board as claimed in claim 8 wherein said physical barrier comprises at least two electrically conductive layers and said electrical circuitry is connected to both of said electrically conductive layers.

11. A tamper resistant circuit board as claimed in claim 8 further comprising means for controlling said at least one programmable logic component to interconnect input terminals to output terminals through at least two different sets of paths through said at least one programmable logic component.

12. A tamper resistant circuit board as claimed in claim 11 wherein said control means for said at least one programmable logic component dynamically changes said at least two different sets of paths.

13. A tamper resistant circuit board as claimed in claim 8 further comprising at least one dummy component mounted on said circuit board and being interconnected by said electrically conducting paths to at least one of said electronic components.

14. A tamper resistant circuit board as claimed in claim 13 wherein said at least one dummy component is connected to one of said at least one programmable logic component.

15. A tamper resistant circuit board as claimed in claim 13 wherein said at least one of said electronic components interconnected to said at least one dummy component generates signals that are sent to said at least one dummy component.

* * * * *